United States Patent [19]

Moore, III

[11] Patent Number: 5,768,342
[45] Date of Patent: Jun. 16, 1998

[54] TELEPHONE SYSTEM LOOP CURRENT DETECTOR

[75] Inventor: Harry W. Moore, III, Watkins Glen, N.Y.

[73] Assignee: Mitel Corporation, Ontario, Canada

[21] Appl. No.: 918,346

[22] Filed: Aug. 26, 1997

Related U.S. Application Data

[63] Continuation of Ser. No. 235,481, Apr. 29, 1994, abandoned.

[51] Int. Cl.$^6$ .................. H04M 3/22; H04M 3/00; G08B 21/00
[52] U.S. Cl. ............ 379/30; 379/188; 379/377; 379/379; 340/659; 340/660; 340/664
[58] Field of Search ............... 379/1, 30, 188, 379/373, 377, 379, 412; 361/87, 115, 118, 119; 340/659, 660, 661, 662, 664

[56] References Cited

U.S. PATENT DOCUMENTS

| | | | |
|---|---|---|---|
| 3,812,303 | 5/1974 | Stewart | 379/27 |
| 4,076,971 | 2/1978 | Mukaemachi | 379/30 |
| 4,103,114 | 7/1978 | Bosik | 379/412 |
| 4,164,632 | 8/1979 | Aagaard | 379/27 |
| 4,282,407 | 8/1981 | Stiefel | 379/377 |
| 4,287,392 | 9/1981 | Melindo | 379/379 |
| 4,326,104 | 4/1982 | Bergida | 379/379 |
| 4,423,292 | 12/1983 | Twurk | 379/379 |
| 4,459,434 | 7/1984 | Benning | 379/373 |
| 4,497,980 | 2/1985 | Gorman | 379/373 |
| 4,524,245 | 6/1985 | Littlefield | 379/373 |
| 4,535,202 | 8/1985 | Meunier | 379/379 |
| 4,558,183 | 12/1985 | Corris et al. | 379/379 |
| 4,558,310 | 12/1985 | McAllise | 340/661 |
| 4,591,663 | 5/1986 | Sullivan | 379/379 |
| 4,707,848 | 11/1987 | Durston | 379/1 |
| 4,727,571 | 2/1988 | Brandsetter | 379/412 |
| 4,896,018 | 1/1990 | Gilliland | 363/56 |
| 4,953,054 | 8/1990 | Fetzer | 361/87 |
| 5,062,131 | 10/1991 | Kanare | 379/21 |
| 5,089,926 | 2/1992 | Kugelman | 340/664 |
| 5,113,304 | 5/1992 | Ozalu | 361/115 |
| 5,140,631 | 8/1992 | Stahl | 379/379 |
| 5,291,545 | 3/1994 | Stahl | 379/379 |

FOREIGN PATENT DOCUMENTS

| | | |
|---|---|---|
| 1 939 510 | 11/1973 | Germany. |
| 2 822 897 | 11/1979 | Germany. |
| 1 561 392 | 2/1980 | United Kingdom. |
| 2 220 820 | 1/1990 | United Kingdom. |

OTHER PUBLICATIONS

Derwent Abstract, DE 2 822 897.

*Primary Examiner*—Steven Saras
*Assistant Examiner*—Vijay Shankar
*Attorney, Agent, or Firm*—Laff, Whitesel, Conte & Saret, Ltd.

[57] ABSTRACT

A current detector for connection in series with a lead carrying current to be detected, has a first branch with a plurality of series connected diodes having an anode end and a cathode end for connection to the lead, a first optocoupler light emitting diode connected in series with a resistor, connected in parallel with the first branch, the optocoupler diode being connected in the same polarity direction as the diodes in the first branch, and a first further diode connected in parallel with the first branch, in opposite polarity direction as the diodes in the first branch.

8 Claims, 3 Drawing Sheets

TELEPHONE SYSTEM LOOP CURRENT DETECTOR

This application is a continuation of application Ser. No. 08/235,481, filed on Apr. 4, 1994 now abandoned.

FIELD OF THE INVENTION

This invention relates to current detectors, and in particular to improved current detectors that can be used as telephone system loop current detectors.

BACKGROUND TO THE INVENTION

Line current loop detectors in a telephone system typically detect either a change of voltage related to current flow change resulting from a subscriber going off-hood or on-hook, or a change of loop current flow in the line itself. A loop current detector, to which the present invention is directed, must be isolated from the loop or other line in which current is to be detected. Typically an optocoupler is used, in which a light emitting diode, optically coupled to a photosensor, is driven by current derived from the voltage difference established across a resistor (e.g. 100 ohms) connected in series with the line in which current is to be detected, and through which the current to be detected passes.

Current through the optocoupler diode is limited by a typically 10 ohm series resistor. This means that the optocoupler diode must reliably carry 100 ma. under some conditions. This severely limits the choices of optocouplers that can be used.

Loop current detectors also sometimes cause problems with line balance, and require optocouplers containing light emitting diodes that are capable of handling wide current ranges. Such diodes have been found to be sensitive to secondary current surges. In order to avoid early failure of the optocoupler, loop currents must be limited to relatively low values, e.g. less than 100 ma.

SUMMARY OF THE PRESENT INVENTION

In accordance with an embodiment of the invention, a loop current detector circuit provides a robust diode based voltage source for powering an optocoupler, in which there is substantial immunity to surges, and which protects the optocoupler to a substantial extent.

In accordance with another embodiment, a loop current circuit utilizes a resistor for providing a voltage source for powering an optocoupler in which the resistor is extremely small, e.g. an order of magnitude less than that required in the prior art, which reduces the likelihood of problems caused by line imbalance resulting from the presence of the resistor.

In accordance with another embodiment, optocouplers are not required, while isolation and longitudinal balance are maintained. Very high loop currents can be handled, factory adjustments are avoided, and the cost of the detector can be very low.

In accordance with an embodiment of the invention, a current detector for connection in series with a lead carrying current to be detected is comprised of a first branch comprising a plurality of series connected diodes having an anode end and a cathode end for connection to said lead, a first optocoupler light emitting diode connected in series with a resistor, connected in parallel with the first branch, the optocoupler diode being connected in the same polarity direction as the diodes in the first branch, and a first further diode connected in parallel with the first branch, in opposite polarity direction as the diodes in the first branch.

In accordance with another embodiment, a current detector for connection in series with a lead carrying current to be detected, is comprised of a first branch comprising a plurality of series connected diodes having an anode end and a cathode end, a first optocoupler light emitting diode connected in series with a resistor, connected in parallel with the first branch, the optocoupler diode being connected in the same polarity direction as the diodes in the first branch, and a full wave rectifier circuit, having a pair of terminals connected to the first branch, and another pair of terminals for connection to said lead.

In accordance with another embodiment, a current detector for connection in series with a lead carrying current to be detected, is comprised of a first resistor having a pair of terminals for connection to the lead, an operational amplifier, a pair of resistors connecting inputs of the amplifier to respective opposite terminals of the first resistor, and a variably tapped resistor connected between the inputs to the amplifier with its tap to a reference source, and a first optocoupler light emitting diode connected in series with a resistor between an output of the amplifier and the reference source. In accordance with another embodiment, a current detector for connection in series with a balanced pair of leads carrying current to be detected, is comprised of a pair of equal valued first resistors, each for connection in series with one of the leads, two pairs of similar antiparallel connected diodes, each pair being connected in parallel with one of the first resistors, a differential amplifier having inputs connected through corresponding equal valued resistors to respective opposite ends of one of the first resistors, a voltage divider having a series connected pair of equal valued resistors and a tap connected to a reference voltage source, a pair of comparators, having noninverting inputs both connected to an output of the differential amplifier and inverting inputs respectively connected to a voltage offset points offset in opposite directions from the voltage source, and forward and reverse detected current output leads connected to respective outputs of the comparators.

BRIEF INTRODUCTION TO THE DRAWINGS

A better understanding of the invention will be obtained by reading the description of the invention below, with reference to the following drawings, in which.

DETAILED DESCRIPTION OF THE INVENTION

Various embodiments of the invention will be described with the application of sensing subscriber loop current in a telephone system. However, it should be recognized that this invention is applicable to, and is intended also to be used in current sensing applications in the consumer, automotive and/or commercial control fields, including the replacement of current operated relays in, for example, industrial alarms.

Figure 1:
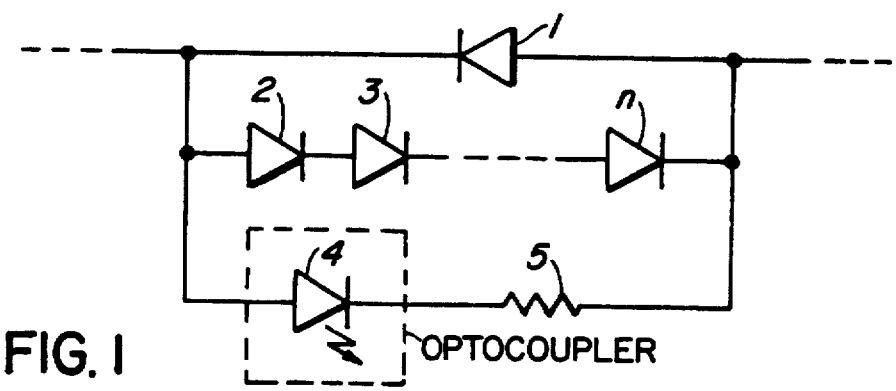
FIG. 1 is a schematic diagram of an embodiment of the invention.

A first embodiment of the invention is shown in FIG. 1. A circuit such as that shown is inserted in series with either the tip or ring line of a subscriber loop. Diode 1 is connected in series with the line in the reverse biased direction relative to the subscriber loop voltage, and diodes 2, 3 ... n are series connected, in parallel with diode 1, in the forward biased direction. An optocoupler light emitting diode 4 (coupled to a photosensitive element, not shown) is connected in series with a current limiting resistor 5, in parallel with and in the same conductivity direction as the diodes 2–n.

Diode 1 provides a low voltage drop conduction path in the reverse conducting direction around diodes 2–n. The latter voltage, in series, create a voltage drop sufficient to cause the optocoupler diode 4 to operate. Thus diode 1 limits the peak inverse voltage rating needed by the optocoupler 4 to the maximum forward conducting voltage of diode 1.

Similarly, diode 1 need have no higher peak inverse voltage rating than the sum of the forward conducting voltages of diodes 2–n.

In operation, diodes 2–n are forward biased, and have a voltage across them falling in the range of the minimum forward conducting voltages of optocoupler 4 plus the IR drop across resistor 5 to the sum of the maximum forward conducting voltages of diodes 2–n. It has been found that this voltage range is much smaller than that obtainable using a simple voltage dropping resistor, as in the prior art. The reliability of sensing an off-hook condition, or other loop current conditions, by means of an optocoupler, is thus significantly enhanced.

Figure 2:
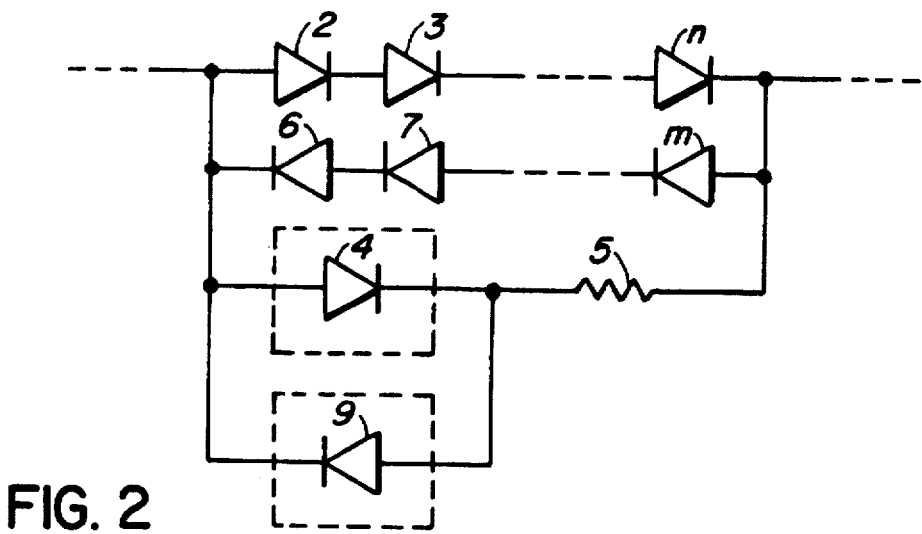
FIGS. 2 and 3 are schematic diagrams of variations of the embodiment of FIG. 1.

FIG. 2 illustrates a variation of the above-described embodiment. In this case, diode 1 is not used, but in its place series connected diodes 6, 7 ... m are used. The peak inverse voltage of diode 1 is thus increased to the total of diodes 6–m. Two optocoupler diodes 4 and 9 are illustrated, connected in antiparallel, the antiparallel diodes in series with resistor 5. In this case the circuit can detect current flow in either direction by means of the respective optocoupler diodes 4 and 9.

Indeed, in the latter case, only a single string of diodes 2–n or 6–m need be used if reverse current is not to be expected and if line balance is not important, the appropriate optocoupler diode voltage being developed in the forward biased direction across the remaining series of diodes.

Figure 3:
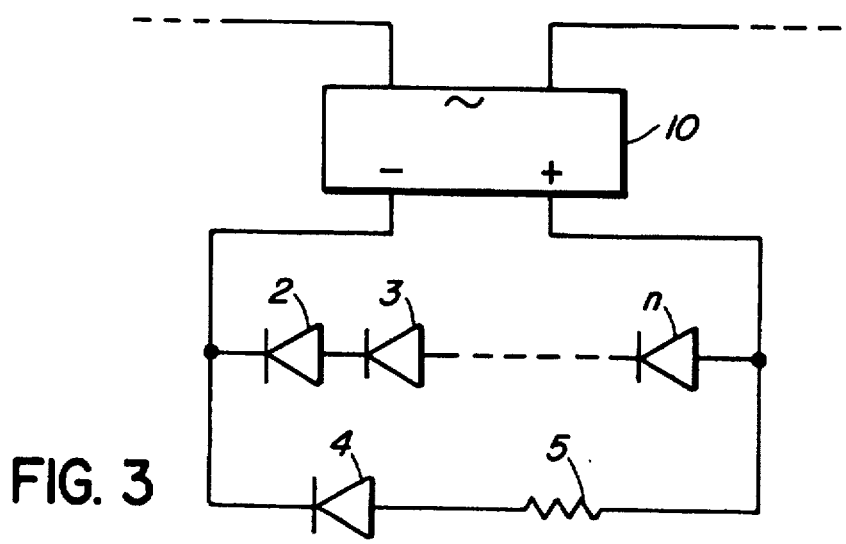

It should be noted that in place of a series string of diode 6–m, a full wave diode bridge 10 may be used, as shown in FIG. 3.

Typical of all of these cases is the case shown in FIG. 2 where the current to be detected is divided between either the diode string 2–n and optocoupler/resistor 4, 5, or the diode string 6–m and optocoupler/resistor 4, 5.

Figure 4:
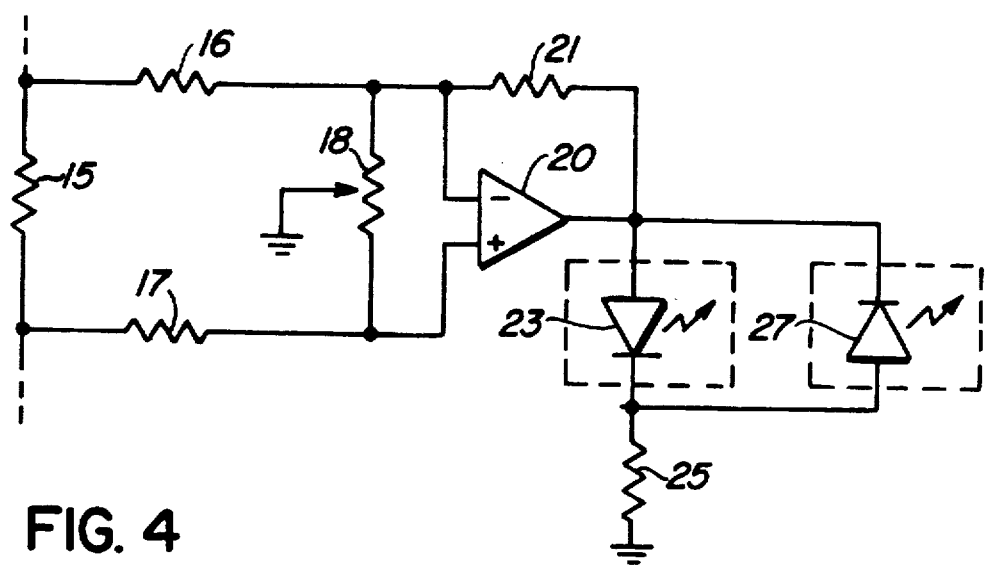
FIG. 4 is a schematic diagram of an embodiment of the invention.

In some cases, optocoupler light emitting diodes are incapable of handling wide current ranges experienced on the line. FIG. 4 illustrates another embodiment of the invention, which substantially eliminates this problem (as in the above embodiments, one circuit as described being inserted in series with each lead of a balanced line, if desired).

A small resistor 15 is connected in series with the lead in which current is to be detected, across which a voltage is developed. A pair of resistors 16 and 17 are connected to respective ends of resistor 15, and in series with a variably tapped resistor 18 such as a potentiometer, the tap of which is connected to ground. An operational amplifier 20 having resistor 21 connected between its output and its inverting input, has its inputs connected across resistor 18. The output of operational amplifier 21 is connected to an optocoupler light emitting diode 23 which is connected in series with a current limiting resistor 25 to ground. Another optocoupler diode 27 may be connected in the reverse polarity direction to diode 25, in parallel with diode 23.

In operation, current in the lead develops a voltage across resistor 15. This voltage is detected in operational amplifier 20, which in response applies current through either of optocoupler diodes 23 or 27, depending on the direction of current flow in the resistor 15 and the resulting direction of current flow out of amplifier 20.

Two important aspects of this embodiment are that the voltage developed across resistor 15, corresponding to the current to be detected, is amplified by the operational amplifier 20, which provides an indication of the on or off hook condition with less chance of line balance problems than prior art circuits. Due to the existence of the amplifier, the resistor 15 can be smaller value than in the prior art, requiring less voltage to be developed across it for detection, thus providing less imbalance. The imbalance results from inexact resistances of corresponding resistors in a pair of balanced leads, or less resistance added to the line in the case of a single unbalanced lead (and also in the case of a pair of balanced leads).

For example, if the forward voltage of the optocoupler light emitting diode is 1.4 volts, the gain of the amplifier is 100, the signal voltage across resistor 15 is 14 mv., the minimum loop current to be detected is 16 ma., the resistor 15 need only be 0.875 ohm, which is an order of magnitude less than is typically used for such an application.

Another important aspect of the present embodiment is the use of variably tapped resistor 18, which facilitates zero setting of the operational amplifier. In addition to establishing a virtually ideal operating point for amplifier 20, this allows the designer to establish a setting for operation of the optocoupler diode which takes into account tolerable current flows in the lead (resistor 15) which are to be ignored and can prebias the optocoupler diode against current flows that are to be ignored or which establish a current base over which other currents are to be sensed.

Figure 5:
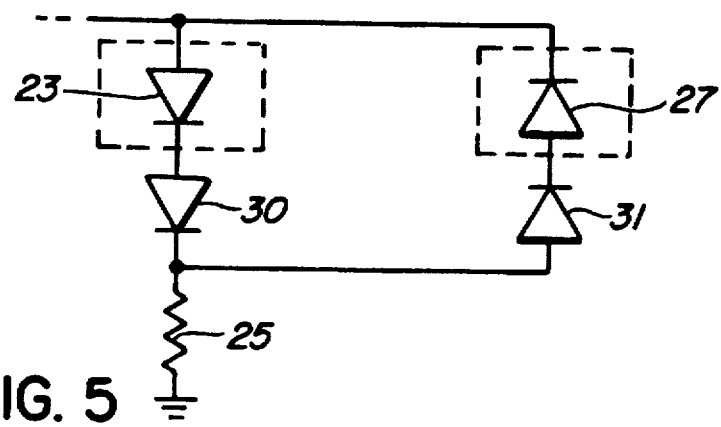
FIGS. 5 and 6 are schematic diagrams of variations of the optocoupler circuit portion of the embodiment of FIG. 4.

If the amplitude of the voltage supply to ground which powers amplifier 20 exceeds the reverse breakdown voltage of the light emitting diodes of the optocouplers, one or more diodes 30 and 31 may be added in series aiding with optocoupler diodes 23 and 27 as shown in FIG. 5, thus to increase the total reverse breakdown voltage of the series pairs.

Figure 6:
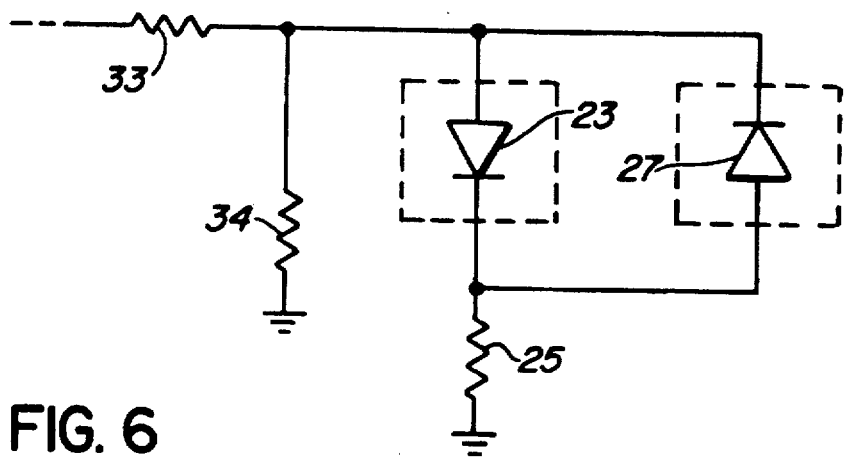

Alternatively, as shown in FIG. 6, a voltage divider shown as series resistors 33 and 34 may be used to reduce the voltage applied to optocoupler diodes 23 and 27.

Figure 7:
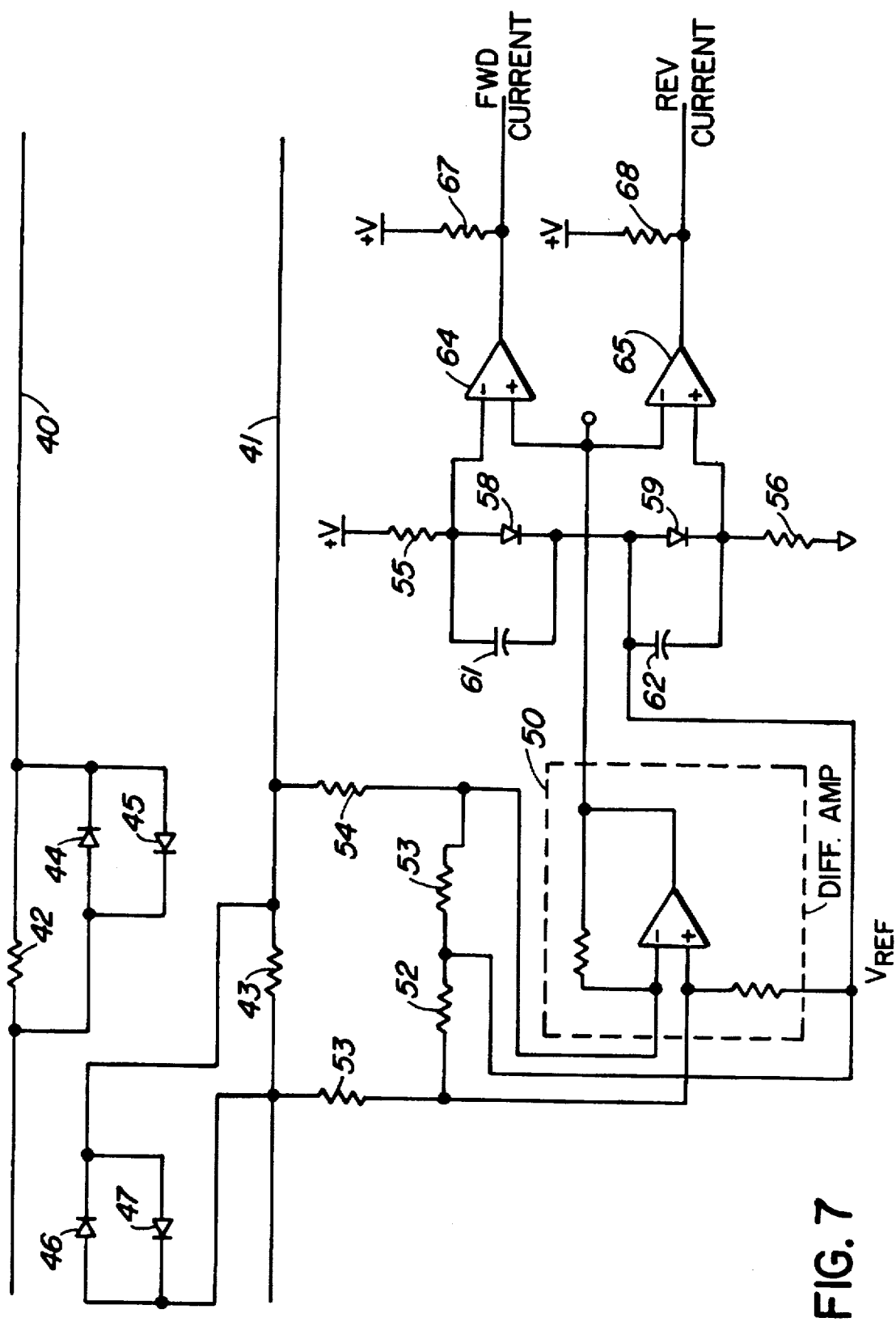
FIG. 7 is a schematic diagram of an embodiment of the invention which does not require the use of optocouplers.

FIG. 7 illustrates another embodiment of the invention, which does not depend on opto-isolators to provide isolation, and which contains other advantages as will be described below.

Small resistors 42 and 43, such as of 10 ohms, are connected in series with corresponding respective leads 40 and 41 of a balanced subscriber loop. Each of the resistors 42 and 43 is bypassed by a corresponding pair of antiparallel diodes 44, 45, and 46,47.

A differential amplifier 50 has its inputs connected in series with corresponding resistors 53 and 54 across one of the resistors, e.g. 43. In a successful prototype the gain of the differential amplifier was 6.6.

A voltage divider comprised of a pair of series connected high valued resistors 52, 53, such as 1 megohm each, is connected across the inputs to the differential amplifier 50, the junction point of resistors 52, 53 being designated as a voltage reference point Vref, the center value of the voltage across the resistors 52, 53.

The reference voltage is established by the series circuit of current limiting resistors 55 and 56 and similarly poled diodes 58 and 59 (the latter preferably shunted by respective filter capacitors 61 and 62), between a voltage source +V and ground, the diodes being poled in the current aiding direction relative to +V and ground. Diodes 58 and 59 act as voltage reference diodes. The reference voltage Vref is taken from the junction of diodes 58 and 59.

The output of differential amplifier 50 is connected to the +input of comparators 64 and 65, and the −inputs of comparators 64 and 65 are connected to anode and cathode terminals respectively of diodes 58 and 59. Outputs of the comparators 64 and 65, which are connected via respective pull-up resistors 67 and 68 to +V, provide logic levels indicating the presence of loop current in the forward and loop current in the reverse direction carried by leads 40 and 41.

It should be noted that the reference voltage Vref is forced to be at the same level as at the inputs to the comparators. This, with the use of a differential amplifier 50 which has a field effect transistor input results in a circuit that does not have to be adjusted during manufacture, thus resulting in reduced cost of manufacture.

In a successful prototype of the invention, loop currents varying between 16 and 125ma. were detected. Diodes 44, 45, 46 and 47 provided a shunt current path around the resistors 42 and 43 when the loop current exceeds 70–90 ma. This corresponds to a power dissipation in resistors 42 and 43 of about 80 milliwatts.

Using the embodiment shown in FIG. 7, longitudinal balance of the two conductor line is maintained. Very high surge currents can be handled with impunity, while in circuits that use optocoupler light emitting diodes, damage to them sometimes occurs. Overall cost of the detector has been found to be relatively low, and common components can be used. Cost is also reduced since no factory adjustment is needed.

By modifying the gain of the differential amplifier, either of larger or smaller loop resistors 42 and 43 can be used. Indeed, both can be accommodated by programming the gain of the differential amplifier either dynamically or by use of external switches, and the loop resistors can be similarly changed in value.

Additional comparators can be used, to allow the use of guarded clearing, as is used in some telephone system environments, such as in the U.K.

With some additional complexity, such as the requirement of factory adjustment, very low value resistors can be used in series with conductors 40 and 41 which are tied to the reference voltage Vref through a large valued resistor.

A person understanding this invention may now conceive of alternative structures and embodiments or variations of the above. All of those which fall within the scope of the claims appended hereto are considered to be part of the present invention.

I claim:

1. A current detector for detecting direct current carried by a lead, comprising:
   a) a first resistor having a pair of terminals connected in series with said lead,
   b) an operational amplifier, a pair of resistors connecting inputs of the amplifier to respective opposite terminals of the first resistor, and a variably tapped resistor corrected between the inputs to the amplifier with its tap to a reference source, and
   c) a first optocoupler light emitting diode connected in series with a resistor between an output of the amplifier and the reference source.

2. A detector as defined in claim 1 in which the reference source is at ground potential.

3. A detector as defined in claim 2 further including a second optocoupler light emitting diode connected in antiparallel with the first optocoupler light emitting diode.

4. A detector as defined in claim 3 including at least one diode connected in series current aiding polarity with each of the first and second optocoupler light emitter diodes.

5. A detector as defined in claim 3, in which the optocoupler light emitting diodes are connected to the output of the amplifier through a voltage divider.

6. A current detector connected in series with a balanced pair of leads carrying current to be detected, comprising:
   a) a pair of equal valued first resistors, each connected in series with one of the leads,
   b) two pairs of similar antiparallel connected diodes, each pair being connected in parallel with one of the first resistors,
   c) a differential amplifier having inputs connected through corresponding equal valued resistors to respective opposite ends of one of the first resistors,
   d) a voltage divider having a series connected pair of equal valued resistors and a tap connected to a reference voltage source,
   e) a pair of comparators, having noninverting inputs both connected to an output of the differential amplifier and inverting inputs respectively connected to voltage offset points offset in opposite directions from the reference voltage source, and
   f) forward and reverse detected current output leads connected to respective outputs of the comparators.

7. A detector as defined in claim 6 in which the reference voltage source is comprised of a pair of diodes connected in series aiding direction, their junction forming the reference voltage source, a pair of resistors each having an end connected to a respective opposite end of the pair of series connected diodes, and each having another end one connected to a voltage rail and one connected to ground.

8. A current detector for connected in series with a balanced pair of leads carrying current to be detected, comprising:
   a) a pair of equal valued first resistors, each connected in series with one of the leads,
   b) two pairs of similar antiparallel connected diodes, each pair being connected in parallel with one of the first resistors,
   c) a differential amplifier having inputs connected through corresponding equal valued resistors to respective opposite ends of one of the first resistors,
   d) a voltage divider having a series connected pair of equal valued resistors and a tap connected to a reference voltage source,
   e) a pair of comparators, having inverting inputs both connected to an output of the differential amplifier and non-inverting inputs respectively connected to voltage offset points offset in the same direction from the reference voltage source, and
   f) forward and reverse detected current output leads connected to respective outputs of the comparators.

* * * * *